United States Patent
Heng et al.

(10) Patent No.: US 7,923,827 B2
(45) Date of Patent: Apr. 12, 2011

(54) SEMICONDUCTOR MODULE FOR A SWITCHED-MODE POWER SUPPLY AND METHOD FOR ITS ASSEMBLY

(75) Inventors: Yang Hong Heng, Muar Johor (MY); Kean Cheong Lee, Melaka (MY); Xaver Schloegel, Sachsenkam (DE); Gerhard Deml, Erding (DE); Ralf Otremba, Kaufbeuren (DE); Juergen Schredl, Mering (DE)

(73) Assignee: Infineon Technologies AG, Neubiberg (DE)

( * ) Notice: Subject to any disclaimer, the term of this patent is extended or adjusted under 35 U.S.C. 154(b) by 56 days.

(21) Appl. No.: 11/995,242

(22) PCT Filed: Jul. 28, 2005

(86) PCT No.: PCT/IB2005/002229
§ 371 (c)(1),
(2), (4) Date: Jul. 16, 2008

(87) PCT Pub. No.: WO2007/012911
PCT Pub. Date: Feb. 1, 2007

(65) Prior Publication Data
US 2009/0001535 A1    Jan. 1, 2009

(51) Int. Cl.
*H01L 23/495* (2006.01)
*H01L 21/00* (2006.01)

(52) U.S. Cl. ......... 257/676; 257/E23.031; 257/E23.037; 257/E23.043; 257/E21.499; 438/123

(58) Field of Classification Search ............... 257/676, 257/E23.031, E21.499, E23.037, E23.043; 438/123
See application file for complete search history.

(56) References Cited

U.S. PATENT DOCUMENTS

| | | | | |
|---|---|---|---|---|
| 4,507,675 | A | * | 3/1985 | Fujii et al. .................... 257/670 |
| 4,888,307 | A |   | 12/1989 | Spairisano et al. |
| 5,309,027 | A |   | 5/1994 | Letterman |
| 5,313,095 | A |   | 5/1994 | Tagawa et al. |
| 5,766,985 | A | * | 6/1998 | Mangiagli et al. ............ 438/121 |
| 6,184,585 | B1 |   | 2/2001 | Martinez et al. |
| 6,465,875 | B2 |   | 10/2002 | Connah et al. |

(Continued)

FOREIGN PATENT DOCUMENTS

DE      4041346      6/1992

(Continued)

OTHER PUBLICATIONS

Philips Semiconductors, Power Semiconductor Applications, S.M.P.S. XP-002372541, p. 108, 1995.

*Primary Examiner* — Zandra Smith
*Assistant Examiner* — Jeremy J Joy
(74) *Attorney, Agent, or Firm* — Dicke, Billig & Czaja, P.L.L.C.

(57) ABSTRACT

Semiconductor module for a Switched-Mode Power Supply comprises at least one semiconductor power switch, a control semiconductor chip and a leadframe comprising a die pad and a plurality of leads disposed on one side of the die pad. The die pad comprises at least two mechanically isolated regions wherein the semiconductor power switch is mounted on a first region of the die pad and the control semiconductor chip is mounted on a second region of the die pad. Plastic housing material electrically isolates the first region and the second region of the die pad and electrically isolates the semiconductor power switch from the control semiconductor chip.

23 Claims, 3 Drawing Sheets

U.S. PATENT DOCUMENTS

| | | |
|---|---|---|
| 6,756,689 B2 | 6/2004 | Nam et al. |
| 2001/0042912 A1 | 11/2001 | Huang |
| 2003/0067065 A1* | 4/2003 | Lee et al. .................. 257/691 |
| 2003/0102489 A1* | 6/2003 | Nam et al. .................. 257/177 |
| 2003/0107120 A1 | 6/2003 | Connah et al. |
| 2004/0004272 A1* | 1/2004 | Luo et al. .................. 257/666 |
| 2004/0169262 A1* | 9/2004 | Oliver et al. .................. 257/676 |
| 2005/0068735 A1 | 3/2005 | Fissore et al. |
| 2006/0033122 A1* | 2/2006 | Pavier et al. .................. 257/177 |
| 2006/0238927 A1 | 10/2006 | Morbe et al. |
| 2007/0057350 A1* | 3/2007 | Otremba .................. 257/666 |

FOREIGN PATENT DOCUMENTS

| | | |
|---|---|---|
| DE | 19716674 | 8/1998 |
| DE | 102005014746 | 10/2006 |
| EP | 0574662 | 12/1993 |
| JP | 8008388 | 1/1996 |
| JP | 88388 | 8/1996 |
| JP | 2003 209217 | 7/2003 |
| KR | 2002004586 A | 1/2002 |
| KR | 2002461237 | 1/2002 |

* cited by examiner

SEMICONDUCTOR MODULE FOR A SWITCHED-MODE POWER SUPPLY AND METHOD FOR ITS ASSEMBLY

CROSS-REFERENCE TO RELATED APPLICATIONS

This Utility patent application is a National Filing under 35 U.S.C. 371 of International Application PCT/IB2005/002229, filed Jul. 28, 2005, incorporated herein by reference.

BACKGROUND

This disclosure relates to a semiconductor module for a Switched-Mode Power Supply (SMPS) and to methods for assembling the module.

For some applications such as in the fields of telecommunication and computer electronics, it is desired to provide multi-device modules for switched-mode power supplies which include a control chip and one or more semiconductor power switches in a single package housing.

A feature of these modules is that the control chip and the power switch must be electrically isolated from each other. This can be achieved by the use of an additional electrical isolation layer positioned between the control chip and the die pad, as is known from U.S. Pat. No. 6,756,689 for example. The electrical isolation layer can be provided by a ceramic plate or by an adhesive tape. Alternatively, an isolation substrate can be provided under the power switch which electrically isolates the power switch from the die pad. However, this structure has the disadvantage that the chip design rules are limited.

These modules suffer from the disadvantage that the additional materials, in particular, the ceramic plate, increase the cost of the package. The isolation provided by an electrically insulating adhesive tape can also be unreliable. Additionally, the complexity of assembling the package is also increased which further increases the costs. These modules also suffer from the problem of delamination at the interfaces between the die pad and the isolation layer and between the isolation layer and the chip.

SUMMARY

Embodiments of the invention provide a semiconductor module for a switched-mode power supply in which the die pad includes at least two mechanically isolated regions. The semiconductor power switch is mounted on one region and the controller IC chip on a further region. The plastic material of the housing can simply and reliably provide electrical isolation of the die pad regions and of the semiconductor power switch and the controller switch.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
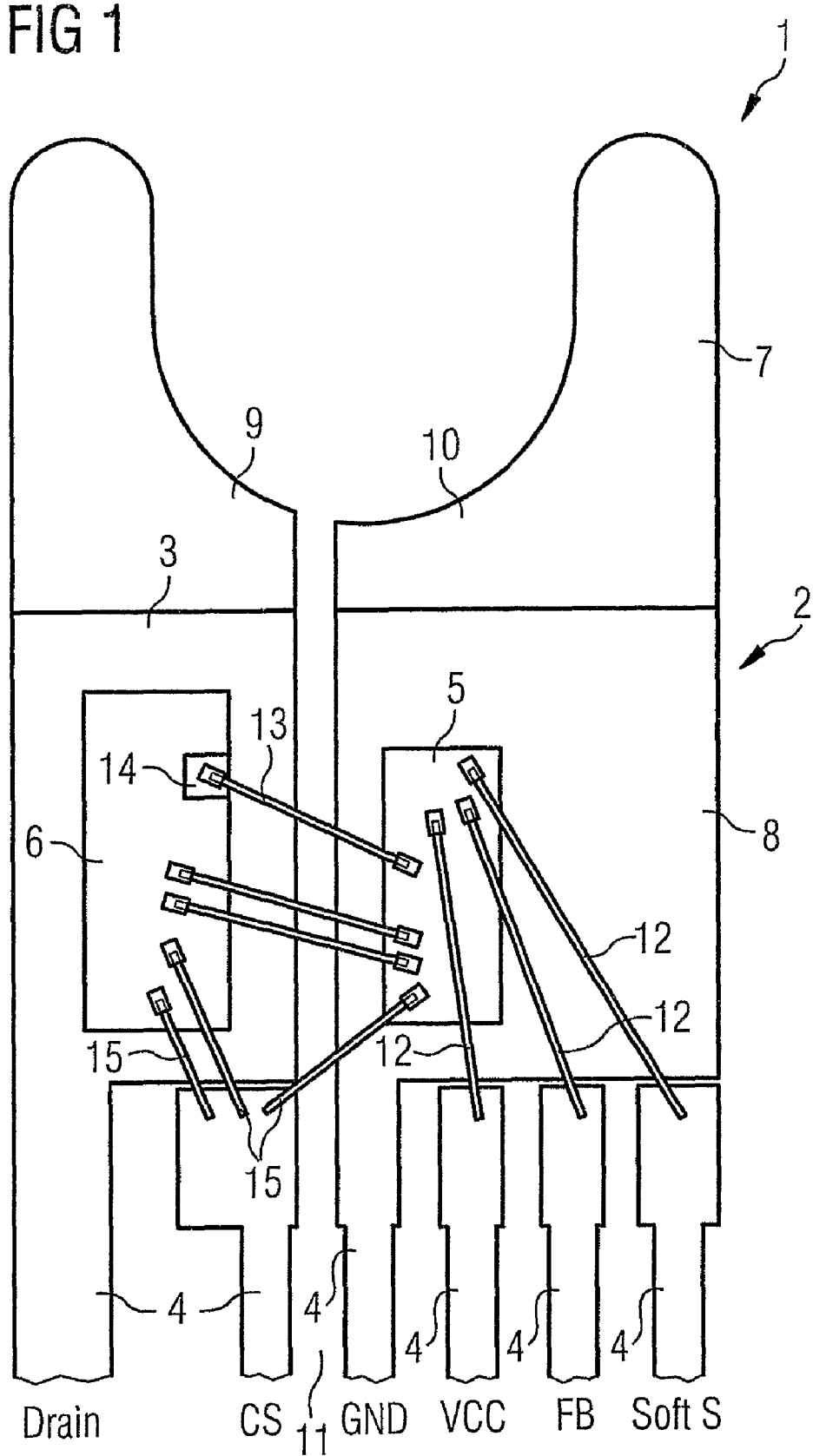
FIG. 1 illustrates a semiconductor module according to a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the invention provide an integrated circuit device including a semiconductor module for a Switched-Mode Power Supply which includes at least one semiconductor power switch having at least one gate electrode, at least one source electrode and at least one drain electrode, a control semiconductor chip and a leadframe. The leadframe includes a die pad and a plurality of leads which are disposed on one side of the die pad. Each lead has an inner portion and an outer portion. At least one lead extends from the die pad and the remaining leads are spaced at a distance from the die pad.

The die pad includes at least two mechanically isolated regions. The semiconductor power switch is mounted on a first region of the die pad and the control semiconductor chip is mounted on a second region of the die pad.

The semiconductor module further includes at least one first bond wire which extends from the control semiconductor chip to the gate electrode of the semiconductor power switch and a plurality of second bond wires. The plurality of second bond wires extend between the power semiconductor chip and at least one lead and extend between the control semiconductor chip and at least one lead.

The semiconductor module also includes plastic housing material which forms the package housing. The plastic housing material encapsulates the control semiconductor chip, the semiconductor power switch, the bond wires and the inner portions of the leads. The plastic housing material electrically isolates the first region and the second region of the die pad and electrically isolates the semiconductor power switch from the control semiconductor chip.

In the description, the semiconductor power switch is described as having at least one source electrode, at least one drain electrode and at least one gate electrode as is used for MOSFET switches. However, this nomenclature is not intended to limit the semiconductor power switch to a MOSFET. For other types of semiconductor power switch, this nomenclature refers to the corresponding feature. For a BJT, gate corresponds to base, source corresponds to emitter and drain corresponds to collector. For a IGBT, source corresponds to emitter and drain corresponds to collector.

Typically, in a semiconductor module which includes at least one power switch and a control chip, the power switch requires a withstand voltage of around 1 kV whereas the control chip requires a voltage of about 1 V. Therefore, the electrical isolation requirements within these types of module are significant.

The semiconductor module of embodiments of the invention includes a die pad with at least two mechanically isolated regions which are electrically isolated from each other by the plastic housing material. The control semiconductor chip is mounted on one region and the semiconductor power switch or switches are mounted on a mechanically and electrically isolated region or regions respectively. The plastic encapsulation material provides the electrical isolation between the control chip and the power switch.

According to embodiments of the invention, the electrical isolation is be provided by a simple mechanical separation of the die pad into isolated regions. The need for additional electrical isolation layers, such as ceramic plates and adhesive tapes, is avoided. Therefore, the problems associated with delamination at the interfaces between the isolation layer and the die pad and between the isolation layer and the semiconductor chip are also avoided. The manufacturing costs of the package are also reduced since the additional assembly processes required to produce this structure are not required.

The two mechanically isolated regions of the die pad can be simply provided by a modification of the leadframe fabrication process. If the leadframe is produced by etching, a modification of the etch mask allows the separation of the die pad into isolated regions during the same process step as used for conventional leadframes including a single die pad. Similarly, if the leadframe is produced by stamping, the two isolated regions of the die pad can be provided without additional processing time or procedures.

The separation of the die pad into two or more regions also has the advantage that the mechanical stress, which arises as a result of the difference in the thermal expansion coefficient of the metal leadframe, the semiconductor material and the plastic encapsulation material, is reduced. This further improves the reliability of the package.

The semiconductor module can include two power switches and is, therefore, suitable for use in a single ended push-pull converter for example. Alternatively, the semiconductor module can include four power switches suitable for use in a full bridge push-pull converter. The number of power switches can be selected according to the type and the requirements of the switched mode Power Supply in which the module will be used. The semiconductor power switch may be a BJT (Bipolar Junction Transistor) or a MOSFET (Metal Oxide Semiconductor Field Effect Transistor) or a IGBT (Isolated Gate Bipolar Transistor) depending on the intended application. The control semiconductor chip may be a logic chip.

In modules including two or four power switches, each power switch may be mounted on a mechanically and electrically isolated region of the die pad. Each semi-conductor power switch is, therefore, mounted on a mechanically isolated region of the die pad and is electrically and mechanically isolated from the other semiconductor power switches. The die pad, therefore, includes a number of regions which corresponds to the number of chips in the module. A single controller IC chip can control two or four power switches by a plurality of bond wires, one bond wire extending between the gate electrode of each power switch and the controller chip.

At least one semiconductor power switch may also further include a diode. The diode may be connected in parallel with the semiconductor power switch. Alternatively, the diode is connected in series with the semiconductor power switch.

The lead extending from the die pad may extend from the second region of the die pad on which the control semiconductor chip is mounted. This lead can provide the ground lead of the module for example. The lead extending from the die pad may also extend from the first region of the die pad on which the semiconductor power switch is mounted. If the drain electrode of the semiconductor power switch is located on the bottom surface of the power switch, the drain electrode can be electrically connected to the drain electrode by an electrically conductive adhesive means or solder, for example. The lead extending from this first region of the die pad, therefore, provides the drain lead of the module.

The semiconductor module may also include at least one support bar which extends from the second region of the die pad. This arrangement is particularly suitable if the region of the die pad is floating, i.e. is not mechanically connected to one of the leads of the module. The support bar has an end surface which is essentially coplanar with the outer surface of the package. The support bars enable isolated or floating regions of the die pad to be mechanically connected together as part of a leadframe strip. The support bars prevent warping or bending of the die pad region during the module assembly process.

The support bar is positioned so that after the encapsulation of the package, the packages can be separated from the leadframe strip by cutting the support bars at the outer external surface of the housing. The end surface of the support bar lies approximately perpendicularly to the length of the support bar and is approximately coplanar with the outer external surface of the package.

To ensure sufficient electrical isolation, the support bars are positioned in the side walls of the package which face in directions away from the side of the package in which the leads are positioned.

Similarly, at least one support bar can be positioned so as to extend from the first region of the die pad on which the semiconductor power switch is mounted. The support bar also has an end surface which is essentially coplanar with the outer surface of the package. This arrangement can be used when the drain electrode of the power switch is located on the upper surface of the chip and is connected by bond wires to a separate drain lead which is not mechanically connected to the first die pad region. The first region of the die pad is, therefore, floating or mechanically isolated from the other parts of the leadframe within the package housing material.

The semiconductor power switch can be mounted on the first region of the die pad by soft solder and the control semiconductor chip can be mounted on the second region of the die pad by adhesive glue. The solder enables the semiconductor power switch to be electrically connected to the first region of the die pad. The separate regions of the die pad, therefore, prevent the spreading of the solder to the control semiconductor chip so that the electrical isolation of the two chips is further improved.

In an embodiment of the invention, the package housing has a TO220 outline. The module may have a variety of number of leads depending on the type of controller chip. The module may have a TO220 package outline with either four pins or 6 pins for example. The disclosed device, therefore, provides a package with improved electrical isolation which has a standard package outline. This enables the package to be mounted and integrated into subsystem circuit boards without modification of the mounting arrangement.

Embodiments of the invention also relate to methods for assembling a semiconductor module for a Switched-Mode Power Supply. At least one semiconductor power switch is provided which has at least one gate electrode, at least one source electrode and at least one drain electrode. A control semiconductor chip and a leadframe are also provided.

The leadframe includes a die pad and a plurality of leads which are disposed on one side of the die pad. Each lead has an inner portion and an outer portion. At least one lead extends from the die pad and the remaining leads are spaced at a distance from the die pad. The die pad includes at least two mechanically isolated regions.

The semiconductor power switch is mounted on a first region of the die pad and the control semiconductor chip is mounted on a second region of the die pad. At least one first bond wire connection is then formed between the control semiconductor chip and the gate electrode of the semiconductor power switch which allows the controller to control the switching state of the power switch. A plurality of second bond wires which extend between the power semiconductor chip and at least one lead and between the control semiconductor chip and at least one lead are formed. This provides the electrical connection access to the semiconductor power switch and to the controller chip from outside of the module.

The control semiconductor chip, the semiconductor power switch, the bond wires and the inner portions of the leads are then encapsulated in a plastic housing material by a transfer molding process. The plastic housing material is electrically insulating and electrically isolates the first region and the second region of the die pad and electrically isolates the semiconductor power switch from the control semiconductor chip. The plastic housing material forms the package housing of the module.

This method has the advantage that a multi-device module for switched mode power supplies can be provided with good electrical isolation of the controller chip and semiconductor power switch without requiring additional process steps to provide the electrical insulation. The electrical isolation is provided by the plastic housing material. The existing assembly line can, therefore, be used without requiring significant modification. This reduces the start-up costs.

The first region and the second region of the die pad may be held in isolation within the cavity of the mold by at least one fixed pin protruding from the mold. After the transfer mold process, the indent formed by the fixed pin in the plastic housing can be filled by filling material. A fixed pin is avoids problems associated with retractable pins.

In methods which use retractable pins, pins are positioned above and below the leadframe so as to hold the die pad in isolation within the cavity. As the encapsulation compound is injected into the mold, the pins are partially retracted. During the curing of the material, the pins are fully retracted. The timing sequence is difficult to control so that the thickness of the layer covering the rear side of the die pad can vary. Furthermore, the retractable pins can jam and the wear rate is high. These problems are avoided by the use of a fixed pin.

The first region and/or the second region of the die pad may be held in isolation within the cavity of the mold by support bars which are clamped by the mold so as to hold the first and/or second regions of the die pad in place. The support bars may, therefore, extend from the first region and/or second region. This has the advantage that mechanically isolated regions of the die pad can be reliably supported in the cavity so that warping or bending of the die pad regions during the transfer molding process, as well as during the other assembly processes, is avoided. This ensures a uniform covering of the components by the plastic encapsulation material and a reliable electrical isolation for the module.

After the transfer mold process, the support bars may be cut such that the support bar has an end surface which is essentially coplanar with the outer surface of the package housing. This ensures that the package outline conforms to the required standards and ensures that the support bar is electrically isolated from the leads of the module.

The control semiconductor chip may be mounted on the second region of the die pad by adhesive. The adhesive may be glue or an adhesive tape and may electrically insulate the control chip from the die pad. The semiconductor power switch is mounted on the first region of the die pad by solder or a soft solder. This enables the semiconductor power switch to be electrically connected to its region of the die pad. As the two regions of the die pad are mechanically separate, different adhesive means can be used to mount the semiconductor power switch and the controller chip without cross-contamination of the two materials.

The mold cavity has dimensions so as to produce a molded module with the desired package outline with the desired number and arrangement of the leads or pins of the module. The cavity may have the dimensions of a TO220 package outline.

FIG. 1 depicts a top view of an integrated circuit device including a semiconductor module 1 according to a first embodiment of the invention. The semiconductor module 1 includes a leadframe 2 which includes a die pad 3 and six leads or pins 4 which are arranged on one side of the die pad 3. The leadframe 2 includes copper or a copper alloy. The semiconductor module 1 also includes a controller IC chip 5 and a MOSFET chip 6 which, in this embodiment, is a CoolMOS chip, as a power switch. The function of the six pins is labelled from left to right in FIG. 1 as follows: Drain, Common Source (CS), Ground (GND), power (VCC), Feedback (FB) and softstart (SoftS).

The package housing of the semiconductor module 1 is not illustrated in FIG. 1 for clarity. However, the inner portion of the leads 4 is positioned within the package housing and the outer portion of the leads 4 extends outside of the package housing and allows electrical access to the controller IC chip 5 and MOSFET 6.

The die pad 3 includes a heat sink portion 7 and a chip mounting region 8. The heat sink portion 7 is located on the side of the die pad 3 which opposes the leads 4. The chip mounting region 8 is, therefore, arranged adjacent the leads 4. Each of the leads 4 extends in a direction essentially perpendicular to the edge of the die pad 3. The leads 4 are, therefore, arranged essentially parallel to each other.

The die pad 3 has two mechanically isolated regions 9 and 10. In this embodiment of the invention, the two regions 9 and 10 of the die pad 3 are separated by a channel 11 which extends in a direction parallel to the six leads 4 of the module 1. The channel 11 is laterally positioned between the common source pin and the ground pin.

The MOSFET power switch 6 is mounted on the first region 9 of the die pad 3 and the control IC chip 5 is mounted on the second region 10 of the die pad 3. Since the two regions of the die pad are mechanically separated from one another, the potential of the two die pad regions is independent from one another. The drain lead extends from the first region 9 and the ground lead extends from the second region 10 of the die pad 3. The remaining leads 4 are spaced at a distance from the die pad 3 and are not mechanically connected to the die pad 3.

In this embodiment of the invention, the controller IC chip 5 is electrically connected to the VCC, FB and SoftS leads by bond wires 12. The control IC chip 5 is also connected to the gate electrode 14 of the MOSFET power switch 6 by a bond wire 13. The source electrode of the MOSFET power switch 6 and the controller chip 5 are connected to the common source lead by a plurality of bond wires 15. For large current applications, the source electrode of the MOSFET 6 is connected by two or more bond wires to the source lead.

The die pad 3, IC control chip 5, MOSFET power switch 6, the pluralities of bond wires 12, 13 and 15 and the inner portions of the leads 4 are encapsulated in the plastic material which forms the housing of the semiconductor module 1. The plastic encapsulation material 24 can be seen in the cross-sectional view of the semiconductor module 1 illustrated in FIG. 4. The plastic material 24 provides the electrical isolation between the two separate regions 9 and 10 of the die pad 3 and provides a reliable electrical isolation of the controller IC chip 5 and MOSFET power switch 6.

Figure 2:
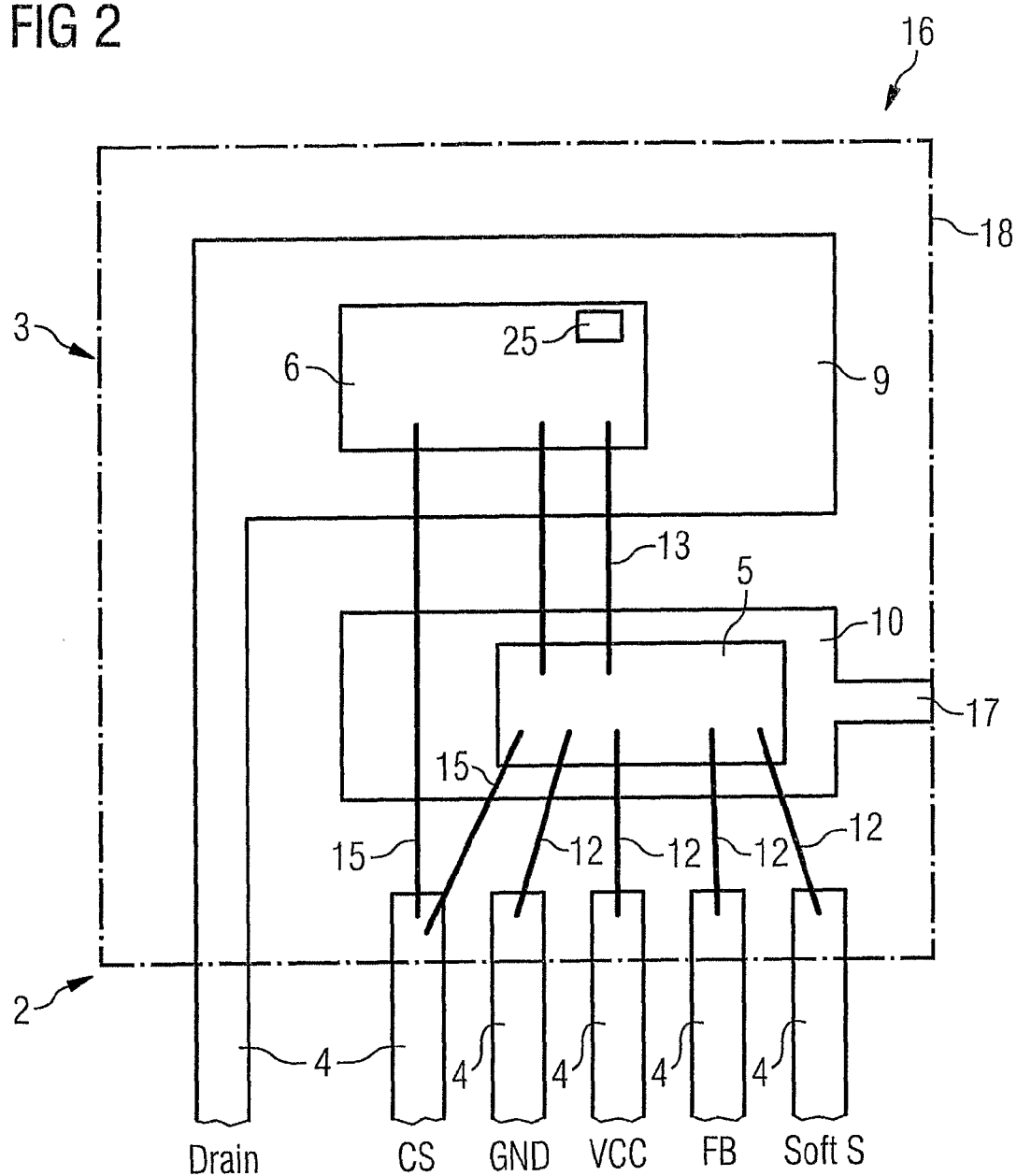
FIG. 2 illustrates a semiconductor module according to a second embodiment of the invention.

FIG. 2 illustrates a schematic diagram of a semiconductor module 16 according to a second embodiment of the invention. The same reference number is used to indicate parts of the module in all of the figures which are essentially the same.

Similarly to the first embodiment of FIG. 1, the semiconductor module 16 includes a leadframe 2 with a die pad 3 which includes two mechanically isolated regions 9 and 10 and six leads or pins 4.

A MOSFET power switch 6 is mounted on the first region 9 of the die pad 3 and a controller IC chip 5 is mounted on the second region 10 of the die pad 3. The six leads 4 are positioned on one side of the die pad 3. The drain lead extends from the first region 9 on which the MOSFET is mounted as in the first embodiment illustrated in FIG. 1. In contrast to the embodiment illustrated in FIG. 1, the second region 10 of the die pad 3 is mechanically isolated from all of the leads 4.

In the second embodiment of the invention, the first region 9 of the die pad 3 is located towards the side of the package opposing the leads 4 and extends the across the width of the module 16 and, therefore, has essentially an L-shape. The second region 10 of the die pad 3 is essentially rectangular and is situated with its long side adjacent the inner portions of the CS, GND, VCC, FB and SoftS leads 4. The second region 10 of the die pad 3 is, therefore, positioned in the cutout forming the L-shape of the first region 9.

The control IC 5 is connected by a plurality of first bond wires 12 to the GND, VCC, FB, SoftS pins and by a second bond wire 13 to the gate electrode 14 of the MOSFET power switch 6. The MOSFET power switch 6 and controller IC 5 are connected by third bond wires 15 to the common source lead. The MOSFET 6 also includes a diode 25 in this embodiment. In FIG. 2, the position of the package housing is indicated by the dashed line 18. The first 9 and second 10 regions of the die pad 3, the controller chip 5, the MOSFET 6, the pluralities of bond wires 12, 13 and 15 and the inner portion of the leads are encapsulated in the plastic material 24 of the package housing 18.

In order to support the mechanically isolated second region 10 of the die pad 3 during the assembly process, a support bar 17 is provided. The support bar 17 extends from the second region 10 in a direction essentially perpendicular to the leads 4 towards the outer surface of the package housing 18. The support bar 17 mechanically links the region 10 to further support structures in the leadframe strip (not shown in the figure). The further support structures are removed to separate the module 16 from the leadframe strip and, therefore, are not illustrated in FIG. 2. The module 16 is, therefore, distinguished by the presence of the end surface of the support bar 17 in the outer surface of the plastic housing 18. Due to the cutting process, this end surface is essentially coplanar with the outer surface of the package housing 18.

A method to assemble a semiconductor module 1, 16 includes the following processes. Firstly, a leadframe strip is provided which includes a plurality of component positions, each of which provides a leadframe 2 for a module. The two regions 9, 10 of the die pad 3 are mechanically held in the leadframe strip by a lead 4 which extends from the die pad 3 and/or by additional support bars 17.

A power switch 6 is mounted on the first region 9 of the die pad 3 and a control chip 5 is mounted on the second region 10 of the die pad 3. The control chip 5 is connected by bond wires 12 to the pins or leads 4 of the leadframe 2 and by bond wire 13 to the gate electrode 14 of the MOSFET power switch 6. The MOSFET 6 is electrically connected by bond wires 15 to the source of pin of the module 1.

The semiconductor chips 5, 6, bond wires 12, 13, 14 and die pad 3 are then encapsulated in a plastic material 24 in a transfer molding process. The electrically insulating plastic material 24 provides the electrical isolation between the controller chip 5 and the MOSFET 6 as the two die pad regions 9, 10 are mechanically separate from each other. The plastic material 24 is, therefore, able to physically isolate and electrically isolate the two chips.

In order to provide sufficient electrical isolation for the rear side of the die pad 3, the die pad 3 is supported within the cavity formed by the upper part and lower part of the mold so that the rear surface of the die pad lies at a distance above the bottom surface of the mold. This can be achieved by clamping the leads 4 and the support bars 17 between the two parts of the mold. Alternatively, or in addition, a pin can be provided in the mold to hold the die pad 3 in isolation within the cavity.

Figure 3:
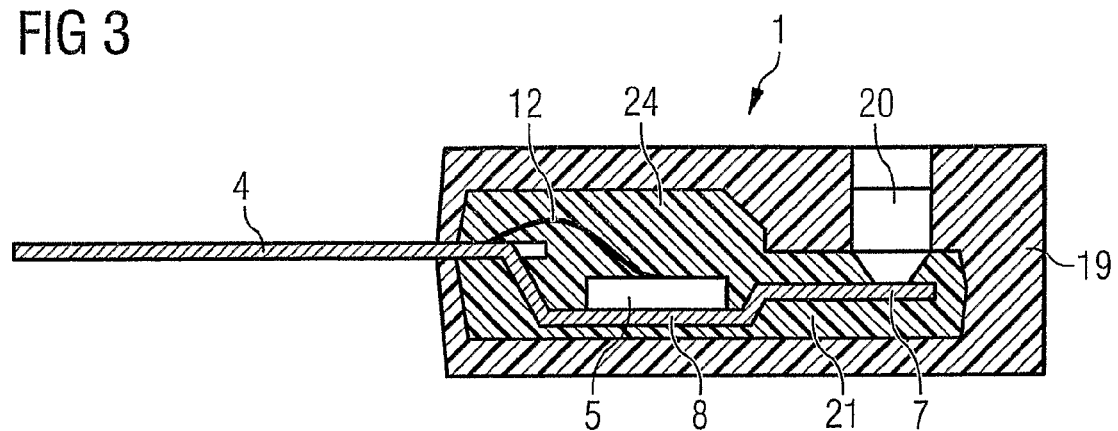
FIG. 3 illustrates the encapsulation of the semiconductor power switch and control semiconductor chip using a fixed pin transfer mold process.

FIG. 3 illustrates the transfer molding process to produce the semiconductor module 1 according to one embodiment of the invention in which the mold 19 includes a fixed pin 20.

FIG. 3 illustrates a cross-sectional view of the semiconductor module 1 of FIG. 1. The controller chip 5 and MOSFET 6 have been mounted on their respective regions of the die pad 3 and the bond wires 12, 13 and 15 have been provided. In the cross-sectional view, it can be seen in that the chip mounting region 8 of the die pad 3 lies in a lower plane within the package housing 18 than the heat sink region 7 of the die pad 3 and the leads 4.

The leads 4 are clamped between the upper and lower part of the mold 19 so that the inner portion of the leads 4 and die pad including the semiconductor chips 5, 6 are located within the cavity 21 of the mold 19. The cavity 21 has, in this embodiment, dimensions which are suitable for producing a module with a TO220 package outline. A fixed pin 20 is provided in the upper part of the mold 19 which protrudes into the cavity 21 so that it is in contact with the upper surface of the heat sink region 7 of the die pad 3. The fixed pin 20 may be detachedly affixed to the upper surface by adhesive which further prevents warping or bending of the die pad 3 during the encapsulation process. The plastic material is then injected into the cavity 21 of the mold 19 and is then cured.

Figure 4:
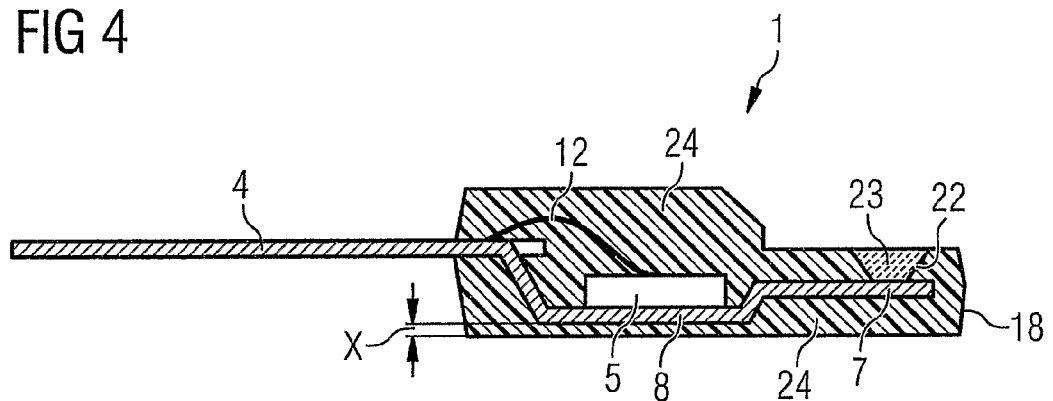
FIG. 4 illustrates the semiconductor module after the mold process of FIG. 3.

FIG. 4 illustrates a cross-sectional view of the semiconductor module 1 after the transfer molding process of FIG. 3 has been carried out. After the mold 19 has been removed, the package housing 18 of the module 1 includes a depression 22 created by the fixed pin 20. This depression 22 can be filled by filling material 23. FIG. 4 also illustrates the thickness x of the package material on the rear surface 25 of the chip and mounting region 8 of the die pad 3. Due to the provision of the fixed pin and/or support bars 17, the thickness of this layer is maintained at a uniform level so that a reliable electrical isolation is provided.

The die pad 3 of the semiconductor module 1, 16, is therefore, completely encapsulated in the plastic material 24 which forms the package housing 18. The provision of the two separate die pad regions 9, 10 which are encapsulated by the plastic material 24 provides a simple reliable and effective electrical isolation of the control chip 5 and the power switch 6. The semiconductor module can, therefore, be reliably used in Switched-Mode Power supply applications, such as automotive applications, which demand a high level of electrical isolation and a robust package housing.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. An integrated circuit device including a semiconductor module for a Switched-Mode Power Supply, comprising:
    a semiconductor power switch having a gate electrode, a source electrode and a drain electrode;
    a control semiconductor chip;
    a leadframe including a die pad and a plurality of leads disposed on one side of the die pad, each lead having an inner portion and an outer portion, wherein the die pad includes first and second mechanically isolated regions, wherein the leads include a drain lead extending from the first region of the die pad, a ground lead extending from the second region of the die pad, and remaining leads are spaced at a distance from the die pad such that the remaining leads are not mechanically connected to the die pad, and wherein the semiconductor power switch is mounted on the first region of the die pad and the control semiconductor chip is mounted on the second region of the die pad;
    a first bond wire extending from the control semiconductor chip to the gate electrode of the semiconductor power switch;
    a plurality of second bond wires extending between the power semiconductor chip and at least one lead and extending between the control semiconductor chip and at least one lead; and
    plastic housing material forming a package housing, the plastic housing material encapsulating the control semiconductor chip, the semiconductor power switch, the bond wires and the inner portions of the leads, the plastic housing material electrically isolating the first region and the second region of the die pad and electrically isolating the semiconductor power switch from the control semiconductor chip.

2. The integrated circuit device of claim 1, wherein the semiconductor module comprises two semiconductor power switches.

3. The integrated circuit device of claim 1, wherein the semiconductor module comprises four semiconductor power switches.

4. The integrated circuit device of claim 2, wherein each semiconductor power switch is mounted on a mechanically isolated region of the die pad.

5. The integrated circuit device of claim 1, wherein the semiconductor power switch is a BJT or a MOSFET or a IGBT.

6. The integrated circuit device of claim 1, wherein the control semiconductor chip is a logic chip.

7. The integrated circuit device of claim 2, wherein at least one semiconductor power switch further comprises a diode.

8. The integrated circuit device of claim 7, wherein the diode is connected in parallel with the semiconductor power switch.

9. The integrated circuit device of claim 7, wherein the diode is connected in series with the semiconductor power switch.

10. The integrated circuit device of claim 1, wherein the lead extending from the die pad extends from the second region of the die pad.

11. The integrated circuit device of claim 1, wherein the lead extending from the die pad extends from the first region of the die pad.

12. The integrated circuit device of claim 1, wherein at least one support bar is provided, the support bar extending from the second region of the die pad and having an end surface which is essentially coplanar with the outer surface of the package housing.

13. The integrated circuit device of claim 1, wherein the semiconductor power switch is mounted on the first region of the die pad by soft solder.

14. The integrated circuit device of claim 1, wherein the control semiconductor chip is mounted on the second region of the die pad by adhesive.

15. The integrated circuit device of claim 1, wherein the package housing has a TO220 outline.

16. A method for assembling a semiconductor module for a Switched-Mode Power Supply, comprising:
    providing a semiconductor power switch having a gate electrode, a source electrode and a drain electrode;
    providing a control semiconductor chip;
    providing a leadframe, the leadframe including a die pad and a plurality of leads disposed on one side of the die pad, each lead having an inner portion and an outer portion, wherein the die pad comprises first and second mechanically isolated regions, wherein the leads include a drain lead extending from the first region of the die pad, a ground lead extending from the second region of the die pad, and the remaining leads are spaced at a distance from the die pad such that the remaining leads are not mechanically connected to the die pad;
    mounting the semiconductor power switch on the first region of the die pad;
    mounting the control semiconductor chip on the second region of the die pad;
    forming at least one first bond wire connection between the control semiconductor chip and the gate electrode of the semiconductor power switch;
    forming a plurality of second bond wires extending between the power semiconductor chip and at least one lead and extending between the control semiconductor chip and at least one lead, and
    encapsulating the control semiconductor chip, the semiconductor power switch, the bond wires and the inner portions of the leads in a plastic housing material by a transfer molding process, wherein the plastic housing material electrically isolates the first region and the second region of the die pad and electrically isolates the semiconductor power switch from the control semiconductor chip, and wherein the plastic housing material forms the package housing.

17. The method for assembling a semiconductor module according to claim 16, wherein the first region and the second region of the die pad are held in isolation within a cavity of a mold by at least one fixed pin protruding from the mold.

18. The method for assembling a integrated circuit device of claim 17, wherein after the transfer molding process, the indent formed by the fixed pin in the plastic housing is filled by filling material.

19. The method for assembling a integrated circuit device of claim 16, wherein the second region is held in isolation within a cavity of a mold by support bars extending from the second region, the support bars being clamped by the mold.

20. The method for assembling a integrated circuit device of claim 19, wherein after the transfer molding process, the support bars are cut such that the support bar has an end surface which is essentially coplanar with the outer surface of the package housing.

21. The method for assembling a integrated circuit device of claim 16, wherein the control semiconductor chip is mounted on the second region of the die pad by adhesive.

22. The method for assembling a integrated circuit device of claim 16, wherein the semiconductor power switch is mounted on the first region of the die pad by solder.

23. The method for assembling a integrated circuit device of claim 16, wherein a mold cavity has the dimensions of a TO220 package outline.

* * * * *